United States Patent
Miyoshi

(10) Patent No.: US 10,455,305 B2
(45) Date of Patent: Oct. 22, 2019

(54) ELECTROACOUSTIC TRANSDUCER

(71) Applicant: FUJIFILM Corporation, Tokyo (JP)

(72) Inventor: Tetsu Miyoshi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/026,392

(22) Filed: Jul. 3, 2018

(65) Prior Publication Data
US 2018/0316995 A1 Nov. 1, 2018

Related U.S. Application Data
(63) Continuation of application No. PCT/JP2016/087353, filed on Dec. 15, 2016.

(30) Foreign Application Priority Data

Jan. 19, 2016 (JP) ................................. 2016-008059

(51) Int. Cl.
*H04R 1/02* (2006.01)
*G10K 11/178* (2006.01)
(Continued)

(52) U.S. Cl.
CPC ........... *H04R 1/025* (2013.01); *H04R 1/2869* (2013.01); *H04R 17/10* (2013.01); *G10K 2210/3221* (2013.01); *H04R 17/005* (2013.01)

(58) Field of Classification Search
CPC .......... H04R 1/02; H04R 1/04; H04R 1/1083; H04R 1/403; H04R 5/023; H04R 7/125;
(Continued)

(56) References Cited

U.S. PATENT DOCUMENTS

2007/0253591 A1* 11/2007 Popilek ................ A47G 9/1045
  381/388
2014/0169580 A1* 6/2014 Levitov ................ G10K 11/178
  381/71.6
(Continued)

FOREIGN PATENT DOCUMENTS

JP 61-185372 U 11/1986
JP 7-8558 A 1/1995
(Continued)

OTHER PUBLICATIONS

International Preliminary Report on Patentability and the Written Opinion of the International Searching Authority (Forms PCT/IB/326, PCT/IB/373 and PCT/ISA/237), dated Aug. 2, 2018, for International Application No. PCT/JP2016/087353, along with an English translation.

(Continued)

*Primary Examiner* — Jesse A Elbin
(74) *Attorney, Agent, or Firm* — Birch, Stewart, Kolasch & Birch, LLP

(57) ABSTRACT

Provided is an electroacoustic transducer capable of reducing the thickness and weight of the entire pillow when a speaker is embedded in the pillow or a headrest, enabling miniaturization of a device by causing the position of the speaker to be close to a position at which the head is placed, and improving the accuracy of signal processing by reducing a load of the signal processing in a case where active noise control is performed, thereby improving a noise reduction effect. The electroacoustic transducer includes: an electroacoustic transduction unit having an electroacoustic transduction film including a polymer composite piezoelectric body in which piezoelectric body particles are dispersed in a viscoelastic matrix formed of a polymer material having viscoelasticity at a normal temperature and thin film electrodes respectively laminated on both surfaces of the poly- (Continued)

mer composite piezoelectric body, and an elastic support disposed in close contact with one principal surface to bend the shape of the electroacoustic transduction film; and a first cushion layer that is in contact with the electroacoustic transduction film on an electroacoustic transduction film side of the electroacoustic transduction unit to cover the electroacoustic transduction unit and is formed of a three-dimensional solid knitted fabric.

19 Claims, 6 Drawing Sheets

(51) Int. Cl.
| | | |
|---|---|---|
| | *H04R 7/04* | (2006.01) |
| | *H04R 17/00* | (2006.01) |
| | *H04R 1/28* | (2006.01) |
| | *H04R 17/10* | (2006.01) |
| | *G10K 9/122* | (2006.01) |
| | *G10K 9/22* | (2006.01) |
| | *A47G 9/10* | (2006.01) |
| | *H04R 5/02* | (2006.01) |
| | *H04R 31/00* | (2006.01) |
| | *H01L 41/18* | (2006.01) |
| | *A47G 9/00* | (2006.01) |

(58) Field of Classification Search
CPC . H04R 7/127; H04R 7/18; H04R 7/20; H04R 17/005; H04R 2410/05; A47G 9/1045; A47G 2009/006; G10K 9/122; G10K 9/125; G10K 9/22; G10K 11/178; G10K 11/17857; G10K 11/17873; G10K 2210/108; G10K 2210/3211; G10K 2210/3219; G10K 2210/3221
USPC ............... 381/71.2, 71.6, 71.7, 162, 190
See application file for complete search history.

(56) References Cited

U.S. PATENT DOCUMENTS

| | | |
|---|---|---|
| 2014/0210309 A1 | 7/2014 | Miyoshi |
| 2016/0255430 A1* | 9/2016 | Fujita .................. B60R 11/0217 381/333 |

FOREIGN PATENT DOCUMENTS

| | | |
|---|---|---|
| JP | 2000-242277 A | 9/2000 |
| JP | 2007-89814 A | 4/2007 |
| JP | 2014-14063 A | 1/2014 |
| JP | 2014-241628 A | 12/2014 |
| JP | 2015-83118 A | 4/2015 |
| WO | WO 2007/055152 A1 | 5/2007 |

OTHER PUBLICATIONS

International Search Report (Form PCT/ISA/210), dated Mar. 7, 2017, for International Application No. PCT/JP2016/087353, along with an English translation.
Japanese Office Action and English translation, dated Sep. 3, 2019, for corresponding Japanese Application No. 2017-562474.

* cited by examiner

ELECTROACOUSTIC TRANSDUCER

CROSS-REFERENCE TO RELATED APPLICATIONS

This application is a Continuation of PCT International Application No. PCT/JP2016/087353 filed on Dec. 15, 2016, which claims priority under 35 U.S.C. § 119(a) to Japanese Patent Application No. 2016-008059 filed on Jan. 19, 2016. The above application is hereby expressly incorporated by reference, in its entirety, into the present application.

BACKGROUND OF THE INVENTION

1. Field of the Invention

The present invention relates to an electroacoustic transducer used in an acoustic device such as a speaker.

2. Description of the Related Art

In recent years, active noise control (ANC) for detecting ambient noise using a microphone, generating pseudo-noise having the same amplitude and inverted phase to the noise using a secondary sound source speaker on the basis of the detected noise signal, and reducing the noise through phase interference has been considered.

As a method of utilizing such ANC, it is proposed that a speaker is assembled into a pillow, sound waves corresponding to external noise are reproduced by the speaker, and the noise is reduced through phase interference, thereby realizing a comfortable sleeping environment.

In addition, a speaker is assembled into a pillow to be used to simply reproduce music.

For example, in JP2007-089814A describes a functional pillow system including a noise source side pillow where a noise source is disposed, a sound receiving point side pillow where a sound receiving point is disposed, and a controller that controls sound, in which the noise sound source pillow includes a reference microphone that detects noises emitted from the noise source and a control speaker that generates a control sound for controlling the magnitude of the sound received at the sound receiving point due to the noise, the sound receiving point side pillow includes at least one or more error microphones that detect the noises emitted from the noise source, the controller includes generating means for generating a control signal for outputting a sound for restricting the magnitude of the noise detected by the error microphones from the control speaker, on the basis of the noise detected by the reference microphone and the noise detected by the error microphones, and outputting means for outputting the control signal to the control speaker.

JP1995-8558A (JP-H7-8558A) describes a comfortable sleep device which includes sound wave generating devices positioned substantially on both sides of a head during sleep, first pressure detectors further positioned on both outer sides of the sound wave generating devices to detect external noise, second pressure detectors positioned on both inner sides of the sound wave generating devices, and an arithmetic device that calculates a sound wave signal in which noise near the second pressure detectors is suppressed by antiphase interference by sound waves from the sound wave generating devices through adaptive control on the basis of a signal of the first pressure detectors and a signal of the second pressure detectors.

JP2014-14063A describes, as a speaker which is thin and lightweight, a speaker which uses an electroacoustic transduction film that includes a polymer composite piezoelectric body in which piezoelectric body particles are dispersed in a viscoelastic matrix formed of a polymer material having viscoelasticity at a normal temperature, thin film electrodes formed on both surfaces of the polymer composite piezoelectric body, and protective layers formed on the surfaces of the thin film electrodes as a vibration plate.

SUMMARY OF THE INVENTION

Since a dynamic speaker in the related art is thick, in a case where the dynamic speaker is mounted in a pillow or a headrest, the overall thickness of the pillow becomes unnecessarily thick and becomes unsuitable for use. In addition, even in a case where a cushion is thinned to reduce the overall thickness of the pillow, the cushioning property is impaired and a user feels an uneven sensation on the head, resulting in poor usability.

Furthermore, the application of the load of the head only to a portion of a vibration plate of the dynamic speaker affects the entire vibration plate, and thus sound cannot be properly reproduced, resulting significantly degraded acoustic quality.

In JP2007-089814A and JP-H7-8558A, the dynamic speaker is disposed at a position distant from the position of the pillow at which the head is placed. Accordingly, unnecessary thickening of the position at which the head is placed, poor usability, and deterioration of acoustic quality can be prevented.

However, even in a case where the dynamic speaker is placed at a position distant from the position of the pillow at which the head is placed, there is a problem that the pillow itself is heavy and thick. In addition, if the position of the dynamic speaker becomes distant from the head, in a case where the dynamic speaker is used as a secondary sound source speaker of active noise control (ANC), there is concern that the effect of noise reduction may be deteriorated, for example, the accuracy of signal processing is reduced or the controllable frequency band is narrowed due to insufficient sound pressure caused by an increase in the distance from a control point or the complexity of a path. It is also possible to enlarge the secondary sound source speaker to compensate for the insufficient sound pressure. However, there is a problem that the pillow itself becomes heavier and thicker.

An object of the present invention is to solve such a problem of the related art, and is to provide an electroacoustic transducer capable of reducing the thickness and weight of the entire pillow when a speaker is embedded in the pillow or a headrest, enabling miniaturization of a device by causing the position of the speaker to be close to a position at which the head is placed, and improving the accuracy of signal processing in a case where active noise control is performed, thereby improving a noise reduction effect in a wide frequency band.

The present inventors have intensively studied to attain the object, and found that by providing an electroacoustic transducer including: an electroacoustic transduction unit having an electroacoustic transduction film including a polymer composite piezoelectric body in which piezoelectric body particles are dispersed in a viscoelastic matrix formed of a polymer material having viscoelasticity at a normal temperature and thin film electrodes respectively laminated on both surfaces of the polymer composite piezoelectric body, and an elastic support disposed in close contact with one principal surface to bend the shape of the electroacoustic transduction film; and a first cushion layer that is in contact with the electroacoustic transduction film on an electroacoustic transduction film side of one or more electroacoustic transduction units to cover the one or more electroacoustic transduction units and is formed of a three-dimensional solid knitted fabric.

That is, the present invention provides an electroacoustic transducer having the following configuration.

(1) An electroacoustic transducer comprising: an electroacoustic transduction unit having an electroacoustic transduction film including a polymer composite piezoelectric body in which piezoelectric body particles are dispersed in a viscoelastic matrix formed of a polymer material having viscoelasticity at a normal temperature and thin film electrodes respectively laminated on both surfaces of the polymer composite piezoelectric body, and an elastic support disposed in close contact with one principal surface of the electroacoustic transduction film to bend the shape of the electroacoustic transduction film; and a first cushion layer that is in contact with the electroacoustic transduction film on an electroacoustic transduction film side of one or more electroacoustic transduction units to cover the one or more electroacoustic transduction units and is formed of a three-dimensional solid knitted fabric.

(2) The electroacoustic transducer according to (1), in which two electroacoustic transduction units are provided, and the two electroacoustic transduction units are disposed at positions symmetric with respect to a center line of a principal surface of the first cushion layer.

(3) The electroacoustic transducer according to (1) or (2), further comprising: a second cushion layer which covers the electroacoustic transduction unit on a surface of the electroacoustic transduction unit, the surface being opposite to the electroacoustic transduction film.

(4) The electroacoustic transducer according to any one of (1) to (3), in which the first cushion layer is in contact with the electroacoustic transduction film.

(5) The electroacoustic transducer according to any one of (1) to (4), in which a forming material of the first cushion layer is polyester or nylon.

(6) The electroacoustic transducer according to any one of (1) to (5), in which a thickness of the first cushion layer is 3 mm to 30 mm.

(7) The electroacoustic transducer according to any one of (1) to (6), in which the second cushion layer is any one of an integral molded product of urethane foam, wadding of inelastic crimped fibers, and a fiber-based cushion obtained by bonding inelastic crimped fibers with a binder.

(8) The electroacoustic transducer according to any one of (1) to (7), further comprising: a microphone disposed in the first cushion layer, in which the microphone is disposed at a position overlapping the electroacoustic transduction unit in a surface direction of a principal surface of the first cushion layer.

(9) The electroacoustic transducer according to (8), in which the electroacoustic transduction unit functions as a speaker which reproduces a noise cancelling signal generated on the basis of a noise signal detected by the microphone.

(10) The electroacoustic transducer according to any one of (1) to (9), in which the elastic support is a viscoelastic support having viscoelasticity.

(11) The electroacoustic transducer according to any one of (1) to (10), in which a curvature of a bent portion of the electroacoustic transduction film changes from a center toward a peripheral portion.

(12) The electroacoustic transducer according to any one of (1) to (11), in which a shape of the bent portion when viewed in a direction perpendicular to the principal surface of the electroacoustic transduction film is a polygonal shape or a circular shape.

According to the present invention, it is possible to provide an electroacoustic transducer capable of reducing the thickness and weight of the entire pillow when a speaker is embedded in the pillow or a headrest, enabling miniaturization of a device by causing the position of the speaker to be close to a position at which the head is placed, and improving the accuracy of signal processing by reducing a load of the signal processing in a case where active noise control is performed, thereby improving a noise reduction effect.

DESCRIPTION OF THE PREFERRED EMBODIMENTS

Hereinafter, an electroacoustic transducer of the present invention will be described in detail based on the suitable embodiments shown in the accompanying drawings.

Descriptions of the constituent elements described below may be made based on representative embodiments of the present invention, but the present invention is not limited to the embodiments.

In this specification, a numerical range expressed by using "to" means a range including numerical values described before and after "to" as a lower limit and an upper limit.

The electroacoustic transducer of the present invention includes: an electroacoustic transduction unit having an electroacoustic transduction film including a polymer composite piezoelectric body in which piezoelectric body particles are dispersed in a viscoelastic matrix formed of a polymer material having viscoelasticity at a normal temperature and thin film electrodes respectively laminated on both surfaces of the polymer composite piezoelectric body, and an elastic support disposed in close contact with one principal surface to bend the shape of the electroacoustic transduction film; and a first cushion layer that is in contact with the electroacoustic transduction film on an electroacoustic transduction film side of one or more of the electroacoustic transduction units to cover the one or more of the electroacoustic transduction units and is formed of a three-dimensional solid knitted fabric.

Figure 1:
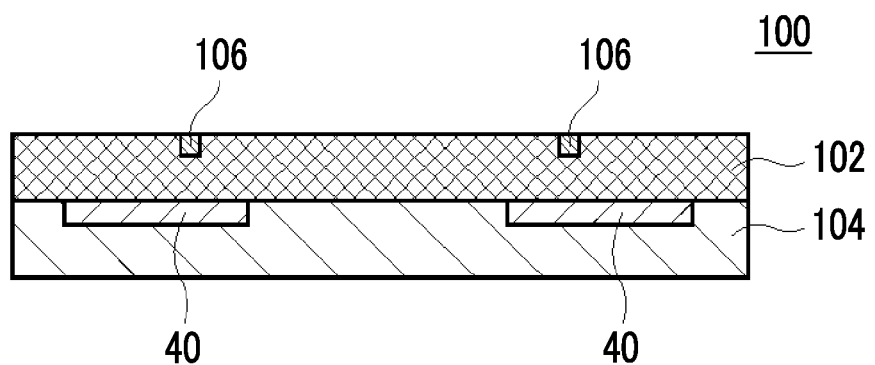
FIG. 1 is a sectional view conceptually illustrating an example of an electroacoustic transducer of the present invention.

FIG. 1 is a sectional view schematically illustrating an example of an electroacoustic transducer of the present invention.

An electroacoustic transducer 100 illustrated in FIG. 1 includes two electroacoustic transduction units (hereinafter, also referred to as "transduction unit") 40, a first cushion layer 102, a second cushion layer 104, and two microphones 106.

The transduction unit 40 in the present invention uses, as a vibration plate, the electroacoustic transduction film in which thin film electrodes are laminated on both surfaces of the polymer composite piezoelectric body in which the piezoelectric body particles are dispersed in the viscoelastic matrix formed of the polymer material having viscoelasticity at a normal temperature. In the transduction unit 40, the shape of the electroacoustic transduction film is held in a bent state. The electroacoustic transduction film is stretched or contacted in an in-plane direction due to the application of a voltage to the electroacoustic transduction film and thus the electroacoustic transduction film moves upward (in the radial direction of sound) or moves downward, thereby performing a conversion between a vibration (sound) and an electrical signal by the vibrations caused by repetition of the stretching and the contraction.

The electroacoustic transducer 100 illustrated in FIG. 1 has a configuration in which the two transduction units 40 are placed in concave portions formed in the second cushion layer 104, the first cushion layer 102 that is a three-dimensional solid knitted fabric is laminated on the second cushion layer 104 to cover the two transduction units 40, and two microphones 106 are disposed on the first cushion layer 102.

In addition, the first cushion layer 102 is disposed on the electroacoustic transduction film (hereinafter, also referred to as "transduction film") side of the transduction unit 40, and the second cushion layer 104 is disposed on the surface of the transduction unit 40 on the side opposite to the transduction film. The first cushion layer 102 is in contact with the transduction film of the transduction unit 40.

In addition, the two microphones 106 are respectively disposed at positions overlapping the transduction units 40 in a surface direction of a principal surface of the first cushion layer 102.

The electroacoustic transducer 100 illustrated in FIG. 1 detects noise using the microphones 106, generates an acoustic signal with the inverted phase to cancel out the noise using a personal computer (PC), an electronic circuit, or the like, based on the detected noise signal, and reproduces the sound having the inverted phase in the transduction unit 40 using an amplifier (amp), thereby reducing the noise. That is, the electroacoustic transducer 100 can be used as a pillow, a headrest, or the like in which a noise cancelling device that performs active noise control (ANC) is embedded.

Here, although described in detail later, the transduction film of the transduction unit 40 has a configuration in which the polymer composite piezoelectric body in which the piezoelectric body particles are dispersed in the viscoelastic matrix formed of the polymer material having viscoelasticity at a normal temperature is a piezoelectric layer and the thin film electrodes are respectively laminated on both surfaces of the piezoelectric layer.

The electroacoustic transducer 100 of the present invention uses such a transduction film as the vibration plate of the transduction unit 40. Even in a case where a load of the head or the like is applied to a portion of the transduction film, its elastic strain energy is immediately converted into heat and is released to the outside. In this case, the other portions excluding the portion of the transduction film are in a state in which substantially no load is applied and thus can perform a conversion between the electrical signal and mechanical vibration.

In the transduction unit 40 which uses the transduction film, since the transduction film itself as the vibration plate is thin, the transduction unit 40 itself can be reduced in thickness and can also be reduced in weight.

Furthermore, since the three-dimensional solid knitted fabric is used as the first cushion layer 102 that covers the transduction unit 40, the sound regenerated by the transduction unit 40 can be transmitted without being attenuated. Accordingly, there is no need to unnecessarily increase the output of the transduction unit 40, and the transduction unit 40 can be miniaturized.

Therefore, in a case where the transduction film side of the transduction unit 40 is configured to be covered with the first cushion layer 102 and in a case of use as a pillow or headrest in which a speaker is embedded, the entire pillow or headrest can be made thin and lightweight. Accordingly, it is possible to prevent unnecessary thickening of the thickness of the position at which the head is placed and deterioration of usability.

In addition, even in a case where a load is applied to the transduction unit 40 (transduction film), sound can be appropriately reduced, so that the transduction unit 40 can be disposed at a position close to the position at which the head is placed. Furthermore, the transduction unit 40 can be disposed at a position on a straight line between the position of the ear and the microphone 106. Therefore, in a case where the transduction unit 40 is used as an ANC speaker, the load of signal processing when a signal for cancelling out noise is generated from the noise detected by the microphone can be reduced, and the accuracy of signal processing can be increased, thereby improving the noise reduction effect.

First, the transduction unit 40 will be described.

Figure 2:
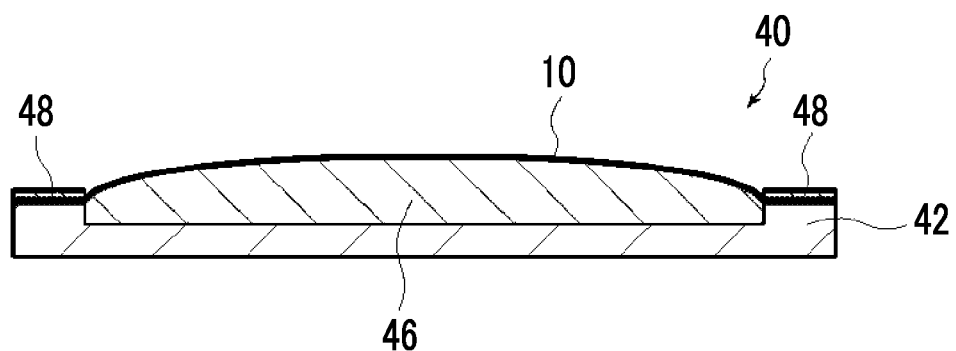
FIG. 2 is a sectional view schematically illustrating an example of an electroacoustic transduction unit.
Figure 3:
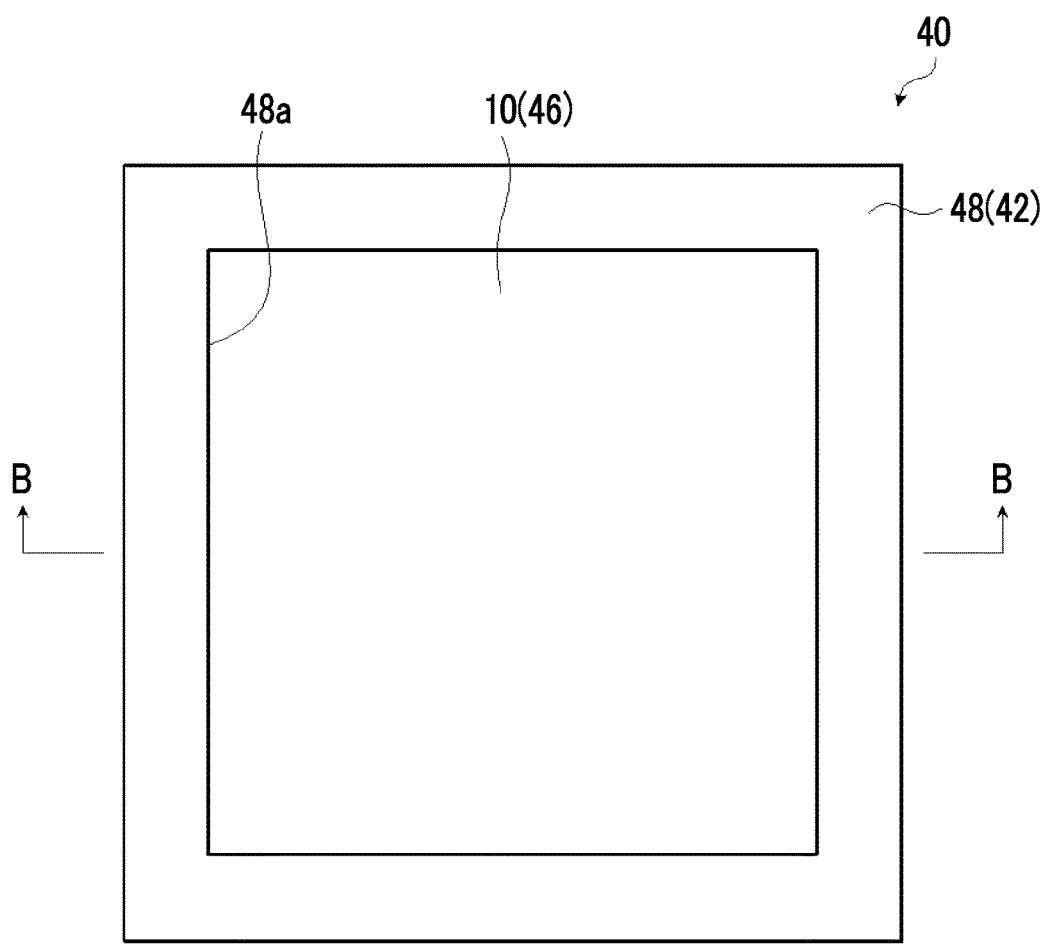
FIG. 3 is a plan view schematically illustrating the example of the electroacoustic transduction unit.

FIG. 2 illustrates a sectional view schematically illustrating an example of the transduction unit 40, and FIG. 3 illustrates a plan view of the transduction unit 40. That is, FIG. 2 is a sectional view taken along line B-B of FIG. 3.

As described above, the transduction unit 40 uses the transduction film as a vibration plate.

As illustrated in the figure, the transduction unit 40 is a flat type speaker, and the vertical direction in FIG. 2 is the vibration direction of the transduction film 10, that is, the radiation direction of a sound. FIG. 3 is a view as seen from the vibration direction of the transduction film 10.

The transduction unit 40 is configured to include the transduction film 10, a case 42, a viscoelastic support 46, and a pressing member 48.

The transduction film 10 is a piezoelectric film which has piezoelectric properties so as to cause the principal surfaces thereof to stretch and contract in response to the state of an electric field, and converts a stretching and contracting movement along a film surface into a vibration in a direction perpendicular to the film surface by being held in a state in which the shape is bent, thereby converting an electrical signal into a sound.

Here, the transduction film 10 used in the transduction unit 40 is a transduction film including a polymer composite piezoelectric body in which piezoelectric body particles are dispersed in a viscoelastic matrix formed of a polymer material having viscoelasticity at a normal temperature, and thin film electrodes laminated on both surfaces of the polymer composite piezoelectric body.

The transduction film 10 will be described later in detail

The case 42 is a holding member that holds the transduction film 10 and the viscoelastic support 46 together with the pressing member 48. The case 42 is a box-shaped case which is formed of plastic, metal, wood, or the like and has an open surface. In the illustrated example, the case 42 has a thin hexahedral shape, and one of the largest surfaces is the open surface. The open portion has a regular quadrilateral shape. The case 42 accommodates the viscoelastic support 46 therein.

In the transduction unit, the shape of the case 42 (that is, the shape of the transduction unit) is not limited to the square tubular shape, and a housing having various shapes such as a cylindrical shape, a rectangular tubular shape having a rectangular bottom surface, or a tubular shape having a polygonal bottom surface is able to be used.

The viscoelastic support 46 has moderate viscosity and elasticity, supports the transduction film 10 while holding the shape of the transduction film 10 in a bent state, and imparts a constant mechanical bias at any place of the transduction film 10 to efficiently convert the stretching and contracting movement of the transduction film 10 into a forward and rearward movement (a movement in the direction perpendicular to the surface of the transduction film).

In the illustrated example, the viscoelastic support 46 has a quadrangular prism shape having a bottom surface shape substantially equal to the bottom surface of the case 42. In addition, the height of the viscoelastic support 46 is larger than the depth of the case 42.

The material of the viscoelastic support 46 is not particularly limited as long as the material has moderate viscosity and elasticity and suitably deforms without impeding the vibration of the piezoelectric film. As an example, wool felt, nonwoven fabric of wool felt including rayon or PET, a foamed material (foamed plastic) such as glass wool or polyurethane, polyester wool, a laminate of a plurality of sheets of paper, a magnetic fluid, a coating material, and the like are exemplified.

The specific gravity of the viscoelastic support 46 is not particularly limited and may be appropriately selected according to the type of the viscoelastic support. As an example, in a case where felt is used as the viscoelastic support, the specific gravity thereof is preferably 50 to 500 kg/m$^3$, and more preferably 100 to 300 kg/m$^3$. In a case where glass wool is used as the viscoelastic support, the specific gravity thereof is preferably 10 to 100 kg/m$^3$.

The pressing member 48 is for supporting the transduction film 10 in a state of being pressed against the viscoelastic support 46, and is a member formed of plastic, metal, wood, or the like in a regular quadrilateral shape with an opening at the center. The pressing member 48 has the same shape as the open surface of the case 42, and the shape of the opening is the same regular quadrilateral shape as the open portion of the case 42.

The transduction unit 40 is configured by accommodating the viscoelastic support 46 in the case 42, covering the case 42 and the viscoelastic support 46 with the transduction film 10, and fixing the pressing member 48 to the case 42 in a state in which the periphery of the transduction film 10 is brought into contact with the open surface of the case 42 by the pressing member 48.

A method of fixing the pressing member 48 to the case 42 is not particularly limited, and various known methods such as a method using screws or bolts and nuts and a method using a holding device are able to be used.

In the transduction unit 40, the height (thickness) of the viscoelastic support 46 is greater than the height of the inner surface of the case 42. That is, in a state before the transduction film 10 and the pressing member 48 are fixed, the viscoelastic support 46 is in a state protruding from the upper surface of the case 42.

Therefore, in the transduction unit 40, the viscoelastic support 46 is held in a state in which the shape of the viscoelastic support 46 is pressed downward by the transduction film 10 and the thickness of the viscoelastic support 46 decreases in thickness toward the peripheral portion of the viscoelastic support 46. That is, the shape of at least a portion of the principal surface of the transduction film 10 is held in a bent state. Accordingly, a bent portion is formed in at least a portion of the transduction film 10. In the transduction unit 40, the bent portion serves as a vibration region. In the following description, the bent portion is also referred to as a vibration region.

At this time, it is preferable that the entire surface of the viscoelastic support 46 is pressed in the surface direction of the transduction film 10 so that the thickness decreases over the entire surface. That is, it is preferable that the entire surface of the transduction film 10 is pressed and supported by the viscoelastic support 46.

In addition, it is preferable that the bent portion formed in this way gradually changes in curvature from the center to the peripheral portion. Accordingly, the resonance frequencies are distributed, resulting in a wider band.

In addition, in the transduction unit 40, the shape of the viscoelastic support 46 is in a state of being compressed more in the thickness direction as it approaches the pressing member 48. However, due to the static viscoelastic effect (stress relaxation), a constant mechanical bias can be maintained at any place of the transduction film 10. Accordingly, the stretching and contracting movement of the transduction film 10 is efficiently converted into a forward and rearward movement, so that it is possible to obtain a flat transduction unit 40 that is thin, achieves a sufficient sound volume, and has excellent acoustic properties.

In the transduction unit 40 having such a configuration, a region of the transduction film 10 corresponding to the opening of the pressing member 48 serves as a region that actually vibrates. That is, the pressing member 48 is a portion that defines the vibration region. Therefore, the transduction unit 40 illustrated in FIG. 2 has a single vibration region.

In a transduction unit which uses a transduction film having piezoelectric properties, it is easy to increase the relative size of a vibration plate to the entire unit compared to a cone speaker generally having a circular vibration plate, and miniaturization is facilitated.

Furthermore, it is preferable that the surface of the transduction unit 40 on the transduction film 10 side and the bent portion are similar. That is, it is preferable that the outer shape of the pressing member 48 and the shape of the opening are similar.

The shape of the bent portion when viewed in a direction perpendicular to the principal surface of the transduction film 10 is not limited to the rectangular shape and may be polygonal or circular. That is, the shape of an opening 48a of the pressing member 48 may be various shapes such as a rectangular shape, a polygonal shape, or a circular shape.

In addition, in the transduction unit 40, the pressing force of the viscoelastic support 46 against the transduction film 10 is not particularly limited, and is 0.005 to 1.0 MPa and particularly preferably about 0.02 to 0.2 MPa in terms of surface pressure at a position where the surface pressure is low.

Moreover, although the thickness of the viscoelastic support 46 is not particularly limited, the thickness thereof before being pressed is 1 to 100 mm, and particularly preferably 10 to 50 mm.

In the illustrated example, the configuration in which the viscoelastic support 46 having viscoelasticity is used is provided, but is not limited thereto, and a configuration using an elastic support having at least elasticity may be provided.

For example, a configuration including an elastic support having elasticity instead of the viscoelastic support 46 may be provided.

As the elastic support, natural rubber and various synthetic rubbers are exemplified.

Here, in the transduction unit 40 illustrated in FIG. 2, the entire peripheral area of the transduction film 10 is pressed against the case 42 by the pressing member 48, but the present invention is not limited thereto.

That is, the transduction unit using the transduction film 10 is also able to use a configuration in which the transduction film 10 is pressed against and fixed to the upper surface of the case 42 by screws, bolts and nuts, holding devices, or the like, for example, at the four corners of the case 42 without using the pressing member 48.

An O-ring or the like may be interposed between the case 42 and the transduction film 10. With this configuration, a damper effect is able to be achieved, and it is possible to prevent the vibration of the transduction film 10 from being transmitted to the case 42, and to obtain excellent acoustic properties.

In addition, the transduction unit using the transduction film 10 may have a configuration without the case 42 that accommodates the viscoelastic support 46.

For example, the viscoelastic support is placed on a support plate having rigidity, the transduction film 10 is placed to cover the viscoelastic support, and the same pressing member as described above is placed on the peripheral portion thereof. Next, a configuration in which the pressing member is fixed to the support plate by screws or the like to press the viscoelastic support together with the pressing member is also able to be used.

The size of the support plate may be greater than the viscoelastic support. Furthermore, by using various vibration plates formed of polystyrene, foamed PET, or carbon fiber as the material of the support plate, an effect of further amplifying the vibration of the transduction unit can be expected.

Moreover, the transduction unit is not limited to the configuration that presses the periphery, and for example, a configuration in which the center of the laminated body of the viscoelastic support 46 and the transduction film 10 is pressed by some means is also able to be used.

That is, various configurations are able to be used by the transduction unit as long as the transduction film 10 is held in a bent state.

Alternatively, a configuration in which a resin film is attached to the transduction film 10 to apply tension thereto (bend) may also be adopted. By configuring the transduction film 10 to be held with the resin film and causing the shape of the transduction film 10 to be held in a bent state, a flexible speaker is able to be obtained.

Alternatively, the transduction film 10 may be configured to be stretched over a bent frame.

In the example illustrated in FIGS. 2 and 3, the configuration in which the transduction film 10 is pressed against the viscoelastic support 46 so as to be supported using the pressing member 48 is provided, but is not limited thereto. For example, a configuration in which the end portion of the transduction film 10 is fixed to the rear surface side of the case 42 using the transduction film 10 which is larger than the open surface of the case 42 may be provided. That is, the case 42 and the viscoelastic support 46 disposed in the case 42 may be covered with the transduction film 10 which is larger than the open surface of the case 42, the end portion of the transduction film 10 may be pulled toward the rear surface side of the case 42 so the transduction film 10 is pressed against the viscoelastic support 46 to be bent with tension, and the end portion of the transduction film may be fixed to the rear surface side of the case 42.

Alternatively, for example, a configuration in which an airtight case is used, the open end of the case is covered and closed by the transduction film, gas is introduced into the case to apply a pressure to the transduction film, and the transduction film is thus held in a state in which the shape of the transduction film is convexly swollen or dented concavely by a negative pressure applied to the case, may be provided.

In addition, in the transduction unit 40 illustrated in FIGS. 2 and 3, the transduction film 10 is pressed by the viscoelastic support 46 and is held in a state in which the principal surface thereof is bent convexly. However, the configuration for holding the shape of the transduction film 10 in a bent state is not particularly limited.

For example, the transduction film 10 itself may be bent by forming a convex portion therein. A forming method of the convex portion is not particularly limited, and various known processing methods of resin films are able to be used. For example, the convex portion is able to be formed by a vacuum pressure molding method or a forming method such as embossing.

Next, the transduction film 10 used in the transduction unit 40 will be described.

Figure 4:
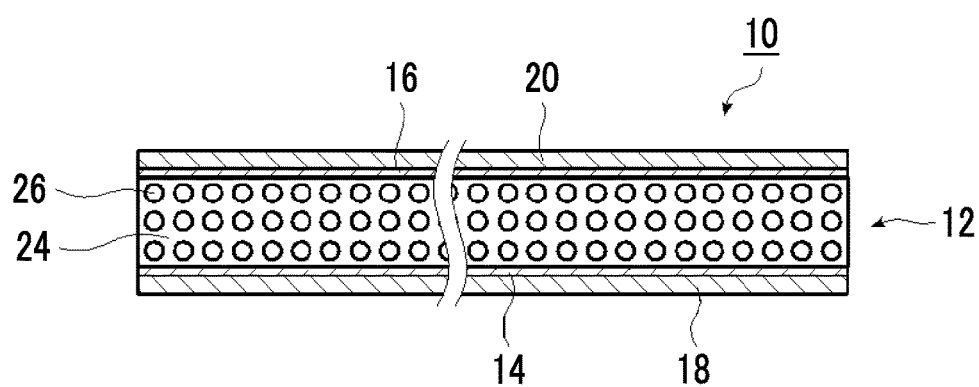
FIG. 4 is a sectional view schematically illustrating an example of an electroacoustic transduction film.

FIG. 4 is a sectional view conceptually illustrating an example of the transduction film 10.

As illustrated in FIG. 4, the transduction film 10 has a piezoelectric layer 12 which is a sheet-like material having piezoelectric properties, a lower thin film electrode 14 laminated on one surface of the piezoelectric layer 12, a lower protective layer 18 laminated on the lower thin film electrode 14, an upper thin film electrode 16 laminated on the other surface of the piezoelectric layer 12, and an upper protective layer 20 laminated on the upper thin film electrode 16.

In the transduction film 10, the piezoelectric layer 12 is a polymer composite piezoelectric body.

As conceptually illustrated in FIG. 4, the polymer composite piezoelectric body forming the piezoelectric layer 12 is obtained by dispersing piezoelectric body particles 26 in a viscoelastic matrix 24 containing a polymer material having viscoelasticity at a normal temperature. Furthermore, herein, the "normal temperature" indicates a temperature range of approximately 0° C. to 50° C.

Although described later, the piezoelectric layer 12 is preferably subjected to polarization processing.

Here, it is preferable that the polymer composite piezoelectric body (the piezoelectric layer 12) has the following requisites.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, in a case where the polymer composite piezoelectric body is hard, large bending stress is generated to that extent, and a crack is generated at the interface between the polymer matrix and the piezoelectric body particles, possibly leading to breakage. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy such that a sound is reproduced. Accordingly, in order to increase the transmission efficiency of the vibration energy, the polymer composite piezoelectric body is required to have suitable hardness. In addition, in a case where the frequency properties of the speaker become smooth, the changed amount of the acoustic quality at the time of when the lowest resonance frequency $f_0$ changes according to a change in the curvature also decreases. Accordingly, the loss tangent of the polymer composite piezoelectric body is required to be suitably large.

As described above, the polymer composite piezoelectric body used in the speaker having flexibility is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

As the polymer material having viscoelasticity at a normal temperature, various known materials are able to be used. Preferably, a polymer material of which the local maximum value of a loss tangent Tan δ at a frequency of 1 Hz at a normal temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time of when the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, in a case where a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, a material having a cyanoethyl group is preferably used, and cyanoethylated PVA is particularly preferably used.

Furthermore, only one of these polymer materials may be used, or a plurality of types thereof may be used in combination (mixture).

The viscoelastic matrix 24 using such a polymer material having viscoelasticity at a normal temperature, as necessary, may use a plurality of polymer materials in combination.

That is, in order to adjust dielectric properties or mechanical properties, other dielectric polymer materials may be added to the viscoelastic matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoro ethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the viscoelastic matrix 24 of the piezoelectric layer 12 in addition to the material having visco elasticity at a normal temperature such as cyanoethylated PVA is not limited to one dielectric polymer, and a plurality of dielectric polymers may be added.

In addition, in order to adjust the glass transition point Tg, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the viscoelastic matrix 24 of the piezoelectric layer 12, the added amount at the time of adding a polymer in addition to the viscoelastic material such as cyanoethylated PVA is not particularly limited, and it is preferable that a ratio of the added polymer to the viscoelastic matrix 24 is less than or equal to 30 vol %.

Accordingly, it is possible to exhibit properties of the polymer material to be added without impairing the viscoelasticity relieving mechanism of the viscoelastic matrix 24, and thus a preferred result is able to be obtained from a viewpoint of increasing a dielectric constant, of improving heat resistance, and of improving adhesiveness between the piezoelectric body particles 26 and the electrode layer.

In addition, for the purpose of increasing the dielectric constant of the piezoelectric layer 12, dielectric particles may be added to the viscoelastic matrix 24.

The dielectric particles are formed of particles having a relative permittivity as high as 80 or more at 25° C.

As the dielectric particles, lead zirconate titanate (PZT), barium titanate ($BaTiO_3$), titanium oxide ($TiO_2$), strontium titanate ($SrTiO_3$), lead lanthanum zirconate titanate (PLZT), zinc oxide (ZnO), a solid solution (BFBT) of barium titanate and bismuth ferrite ($BiFeO_3$), and the like are exemplified. Among them, it is preferable to use barium titanate ($BaTiO_3$) as the dielectric particles from a viewpoint of having a high relative permittivity.

It is preferable that the average particle diameter of the dielectric particles is less than or equal to 0.5 μm.

In addition, the volume fraction of the dielectric particles with respect to the total volume of the viscoelastic matrix and the dielectric particles is preferably 5% to 45%, more preferably 10% to 30%, and particularly preferably 20% to 30%.

The piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are exemplified.

Furthermore, only one type of these ceramics particles may be used, or a plurality of types thereof may be used in combination.

The particle diameter of the piezoelectric body particles 26 may be appropriately selected according to the size or usage of the transduction film 10, and is preferably 1 to 10 μm according to the consideration of the present inventors.

By setting the particle diameter of the piezoelectric body particles 26 to be in the range described above, a preferred result is able to be obtained from a viewpoint of making high piezoelectric properties and flexibility compatible and improving voltage resistance.

In addition, in FIG. 4, the piezoelectric body particles 26 in the piezoelectric layer 12 are uniformly dispersed in the viscoelastic matrix 24 with regularity. However, the present invention is not limited thereto.

That is, in the viscoelastic matrix 24, the piezoelectric body particles 26 in the piezoelectric layer 12 are preferably uniformly dispersed, and may also be irregularly dispersed.

In the transduction film 10, a quantitative ratio of the viscoelastic matrix 24 and the piezoelectric body particles 26 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the piezoelectric body particles 26 in the piezoelectric layer 12 is preferably 30% to 70%, particularly preferably greater than or equal to 50%. Therefore, the volume fraction thereof is more preferably 50% to 70%.

By setting the quantitative ratio of the viscoelastic matrix 24 and the piezoelectric body particles 26 to be in the range described above, it is possible to obtain a preferred result from a viewpoint of making high piezoelectric properties and flexibility compatible.

In addition, in the transduction film 10, the thickness of the piezoelectric layer 12 is also not particularly limited, and may be appropriately set according to the size of the transduction film 10, the usage of the transduction film 10, properties required for the transduction film 10, and the like.

Here, according to the consideration of the present inventors, by reducing the thickness of the piezoelectric layer 12, the degree of bending due to its own weight can be reduced, and by reducing the weight, the followability of the piezoelectric film to the applied voltage is improved, thereby improving the sound pressure or acoustic quality. In addition, flexibility can be imparted thereto. On the other hand, if the piezoelectric layer 12 is too thin, in a case where a voltage is continuously applied or a high voltage is applied, a local short-circuit may occur regarding rigidity. Furthermore, the rigidity may decrease.

From the above viewpoint, the thickness of the piezoelectric layer 12 is preferably 5 µm to 100 µm, more preferably 8 µm to 50 µm, even more particularly preferably 10 to 40 µm, and particularly preferably 15 to 25 µm.

Furthermore, as described above, it is preferable that the piezoelectric layer 12 is subjected to polarization processing (poling). The polarization processing will be described below in detail.

As illustrated in FIG. 4, the transduction film 10 has a configuration in which the lower thin film electrode 14 is formed on one surface of the piezoelectric layer 12, the lower protective layer 18 is formed thereon, the upper thin film electrode 16 is formed on the other surface of the piezoelectric layer 12, and the upper protective layer 20 is formed thereon. Here, the upper thin film electrode 16 and the lower thin film electrode 14 form an electrode pair.

In addition to these layers, the transduction film 10 may further include, for example, an electrode lead-out portion that leads out the electrodes from the upper thin film electrode 16 and the lower thin film electrode 14, and an insulating layer which covers a region where the piezoelectric layer 12 is exposed for preventing a short circuit or the like.

As the electrode lead-out portion, the thin film electrode and the protective layer are provided with parts protruding in a convex shape on the outside in the surface direction of the piezoelectric layer. Alternatively, the electrode lead-out portion may be provided by forming a hole by removing a portion of the protective layer, inserting a conductive material such as a silver paste into the hole, and electrically connecting the conductive material and the thin film electrode.

In each of the thin film electrodes, the number of electrode lead-out portions is not limited to one, and two or more electrode lead-out portions may be included. Particularly, in a case of the configuration in which the electrode lead-out portion is provided by removing a portion of the protective layer and inserting the conductive material into the hole, three or more electrode lead-out portions are provided to ensure more reliable electrical connection.

The transduction film 10 has a configuration in which both surfaces of the piezoelectric layer 12 are interposed between the electrode pair, that is, the upper thin film electrode 16 and the lower thin film electrode 14 and the laminated body is further interposed between the upper protective layer 20 and the lower protective layer 18.

The region interposed between the upper thin film electrode 16 and the lower thin film electrode 14 as described above is driven according to an applied voltage.

In the transduction film 10, the upper protective layer 20 and the lower protective layer 18 have a function of covering the upper thin film electrode 16 and the lower thin film electrode 14 and applying appropriate rigidity and mechanical strength to the piezoelectric layer 12. That is, there may be a case where, in the transduction film 10 of the present invention, the piezoelectric layer 12 formed of the viscoelastic matrix 24 and the piezoelectric body particles 26 exhibits extremely superior flexibility under bending deformation at a slow vibration but has insufficient rigidity or mechanical strength depending on the usage. As a compensation for this, the transduction film 10 is provided with the upper protective layer 20 and the lower protective layer 18.

In addition, since the lower protective layer 18 and the upper protective layer 20 are different from each other only in position and have the same configuration, in the following description, in a case where there is no need to distinguish between the lower protective layer 18 and the upper protective layer 20, both the members are collectively referred to as a protective layer.

The upper protective layer 20 and the lower protective layer 18 are not particularly limited, and may use various sheet-like materials. As an example, various resin films are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyamide (PA), polyethylene naphthalate (PEN), triacetylcellulose (TAC), and a cyclic olefin-based resin are suitably used.

Among them, polyamide, polyimide, polyetherimide, polycarbonate, and triacetylcellulose are suitably used from a viewpoint of exhibiting excellent heat resistance by causing the glass transition temperature Tg to be 150° C. or higher. From these, damage to the appearance due to heat generated at the time of applying a voltage is able to be prevented, and it is possible to withstand a shelf test and a driving test at a high temperature.

The thicknesses of the upper protective layer 20 and the lower protective layer 18 are not particularly limited. In addition, the thicknesses of the upper protective layer 20 and the lower protective layer 18 may basically be identical to each other or different from each other.

Here, in a case where the rigidity of the upper protective layer 20 and the lower protective layer 18 excessively increases, not only is the stretching and contracting of the piezoelectric layer 12 constrained, but also the flexibility is impaired, and thus it is advantageous in a case where the thicknesses of the upper protective layer 20 and the lower protective layer 18 become thinner unless mechanical strength or excellent handling ability as a sheet-like material is required.

According to the consideration of the present inventors, in a case where the thickness of each of the upper protective layer 20 and the lower protective layer 18 is less than or equal to twice the thickness of the piezoelectric layer 12, it is possible to obtain a preferred result from a viewpoint of compatibility between ensuring the rigidity and appropriate flexibility, or the like.

For example, in a case where the thickness of the piezoelectric layer 12 is 20 µm and the upper protective layer 20 and the lower protective layer 18 are formed of PET, the thickness of each of the upper protective layer 20 and the lower protective layer 18 is preferably less than or equal to 40 µm, more preferably less than or equal to 20 µm, and particularly preferably less than or equal to 15 µm.

In the transduction film 10, the upper thin film electrode (hereinafter, also referred to as an upper electrode) 16 is formed between the piezoelectric layer 12 and the upper protective layer 20, and the lower thin film electrode (hereinafter, also referred to as a lower electrode) 14 is formed between the piezoelectric layer 12 and the lower protective layer 18.

The upper electrode 16 and the lower electrode 14 are provided to apply an electric field to the transduction film 10 (the piezoelectric layer 12).

In addition, since the lower electrode 14 and the upper electrode 16 are different from each other only in size and position and have the same configuration, in the following description, in a case where there is no need to distinguish between the lower electrode 14 and the upper electrode 16, both the members are collectively referred to as a thin film electrode.

In the present invention, a forming material of the upper electrode 16 and the lower electrode 14 is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, and the like are exemplified. Among them, any one of copper, aluminum, gold, silver, platinum, and indium-tin oxide is suitably exemplified.

In addition, a forming method of the upper electrode 16 and the lower electrode 14 is not particularly limited, and as the forming method, various known methods such as a vapor-phase deposition method (a vacuum film forming method) such as vacuum vapor deposition or sputtering, film formation using plating, a method of adhering a foil formed of the materials described above, and a coating method, are able to be used.

Among them, in particular, by the reason that the flexibility of the transduction film 10 is able to be ensured, a copper or aluminum thin film formed by using the vacuum vapor deposition is suitably used as the upper electrode 16 and the lower electrode 14. Among them, in particular, the copper thin film formed by using the vacuum vapor deposition is suitably used.

The thicknesses of the upper electrode 16 and the lower electrode 14 are not particularly limited. In addition, the thicknesses of the upper electrode 16 and the lower electrode 14 may basically be identical to each other or different from each other.

Here, like the upper protective layer 20 and the lower protective layer 18 described above, in a case where the rigidity of the upper electrode 16 and the lower electrode 14 excessively increases, not only is stretching and contracting of the piezoelectric layer 12 constrained, but also flexibility is impaired. For this reason, in a case where the upper electrode 16 and the lower electrode 14 are in a range where electrical resistance does not excessively increase, it is advantageous in a case where the thickness becomes thinner.

In addition, according to the consideration of the present inventors, in a case where the product of the thicknesses of the upper electrode 16 and the lower electrode 14 and the Young's modulus is less than the product of the thicknesses of the upper protective layer 20 and the lower protective layer 18 and the Young's modulus, the flexibility is not considerably impaired, which is suitable.

For example, in a case of a combination of the upper protective layer 20 and the lower protective layer 18 formed of PET (Young's modulus: approximately 6.2 GPa) and the upper electrode 16 and the lower electrode 14 formed of copper (Young's modulus: approximately 130 GPa), in a case where the thickness of the upper protective layer 20 and the lower protective layer 18 are 25 μm, the thickness of the upper electrode 16 and the lower electrode 14 are preferably less than or equal to 1.2 μm, more preferably less than or equal to 0.3 μm, and particularly preferably less than or equal to 0.1 μm.

In addition, the thin film electrodes are not necessarily formed to correspond to the entire surface of the piezoelectric layer 12 (the lower protective layer 18 and/or the upper protective layer 20).

That is, at least one of the thin film electrodes may be configured to be smaller than, for example, the piezoelectric layer 12, and the piezoelectric layer 12 and the protective layer may be configured to be in direct contact with each other in the peripheral portion of the transduction film 10.

Alternatively, the protective layers where the thin film electrodes are formed on the entire surfaces are not necessarily formed to correspond to the entire surface of the piezoelectric layer 12. In this case, a second protective layer which comes into direct contact with the piezoelectric layer 12 may be configured to be separately provided on the surface side of the protective layer.

Furthermore, a coating layer may be further provided for the purpose of improving the adhesion between the thin film electrode and the piezoelectric layer 12, improving flexibility, and the like. In this case, the coating layer may be applied either onto the thin film electrode or onto the piezoelectric layer 12.

In this case, as a polymer component, thermoplastic resins such as polymethacrylate, polyurethane, a polyester polyolefin, PVA, and polystyrene, and thermosetting resins such as a phenol resin and a melamine resin can be used. Among them, a dielectric polymer is preferably used in order to improve the acoustic performance. Specifically, the above-mentioned polymers and the like can be preferably used. Besides the polymer component, high dielectric particles, an antistatic agent, a surfactant, a thickener, a crosslinking agent, and the like may be added.

In addition, in the illustrated example, the layer configuration of the transduction film 10 includes the piezoelectric layer 12, the lower thin film electrode 14 laminated on one surface of the piezoelectric layer 12, the lower protective layer 18 laminated on the lower thin film electrode 14, the upper thin film electrode 16 laminated on the other surface of the piezoelectric layer 12, and the upper protective layer 20 laminated on the upper thin film electrode 16, but is not limited thereto. In addition to these layers, the layer configuration of the transduction film 10 may further include, for example, an insulating layer which covers a region where the piezoelectric layer 12 is exposed for preventing a short circuit or the like, a colored layer which covers the thin film electrode, and the like.

For example, the layer configuration in a case of having the colored layer may be a configuration having the piezoelectric layer 12, the lower thin film electrode 14 laminated on one surface of the piezoelectric layer 12, a lower colored layer laminated on the lower thin film electrode 14, the lower protective layer 18 laminated on the lower colored layer, the upper thin film electrode 16 laminated on the other surface of the piezoelectric layer 12, an upper colored layer laminated on the upper thin film electrode 16, and the upper protective layer 20 laminated on the upper colored layer.

By providing the colored layers, rusting of the upper thin film electrode 16 and the lower thin film electrode 14 is not allowed to be visible from the outside.

From a viewpoint of not allowing rusting of the thin film electrodes to be visible from the outside, the transmission density of the colored layer is preferably more than or equal to 0.3, and more preferably more than or equal to 0.5.

The transmission density is an optical density measured as a ratio of transmitted light to incoming rays. The transmittance at a transmission density of 0.3 is about 50%, and the transmittance at a transmission density of 0.5 is about 30%.

The thickness of the colored layer is preferably less than or equal to 1 μm, more preferably less than or equal to 100 nm, and particularly preferably less than or equal to 40 nm.

The electrical resistivity of the colored layer is preferably low, and is preferably less than or equal to $1 \times 10^{-7}$ Ωm.

A forming material of the colored layer is not particularly limited as long as the forming material satisfies the transmission density and is not discolored by rusting or the like.

Specifically, as the forming material of the colored layer, metals such as indium, nickel, titanium, aluminum, gold, platinum, and chromium, inorganic pigments such as carbon black (CB), titanium oxide, zinc oxide, barium sulfate, organic pigments based on quinacridone, azo, benzimidazolone, phthalocyanine, and anthraquinone, a member having pores therein and having light scattering properties, and the like are exemplified.

From a viewpoint of the transmission density, the thickness, and the electrical resistivity, metals are preferably used as the forming material of the colored layer, and among them, nickel is more preferable.

In addition, a forming method of the colored layer is not particularly limited, and the colored layer may be formed in various known methods depending on the materials.

For example, in a case of using metals as the forming material of the colored layer, a vapor-phase deposition method (a vacuum film forming method) such as vacuum vapor deposition or sputtering, film formation using plating, a method of adhering a foil formed of the materials described above, and the like are able to be used. It is preferable to form the colored layer using vacuum vapor deposition from a viewpoint of forming the colored layer to be thinner.

In the case of using the pigments as the forming material of the colored layer, an application method, printing, and the like are able to be used.

In addition, a method of transferring the colored layer formed in advance is also able to be used.

The colored layer is not limited to the configuration in which the colored layers are respectively provided on the upper electrode 16 side and the lower electrode 14 side, and a configuration in which the colored layer is provided on at least one side may be provided.

As described above, the transduction film 10 has a configuration in which the piezoelectric layer 12 in which the piezoelectric body particles 26 are dispersed in the viscoelastic matrix 24 containing the polymer material having viscoelasticity at a normal temperature is interposed between the upper electrode 16 and the lower electrode 14 and the laminated body is interposed between the upper protective layer 20 and the lower protective layer 18.

In the transduction film 10, it is preferable that the local maximum value in which the loss tangent (Tan δ) at a frequency of 1 Hz according to the dynamic viscoelasticity measurement is greater than or equal to 0.1 exists at a normal temperature.

Accordingly, even in a case where the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the transduction film 10, it is preferable that the storage elastic modulus (E') at a frequency of 1 Hz according to the dynamic viscoelasticity measurement is 10 to 30 GPa at 0° C., and 1 to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0E+05 to 1.0E+06) N/m at 50° C.

Accordingly, the transduction film 10 is able to have appropriate rigidity and mechanical strength within a range not impairing the flexibility and the acoustic properties of the transduction film 10.

Furthermore, in the transduction film 10, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time of when the lowest resonance frequency $f_0$ is changed according to the change in the curvature of the speaker.

Next, an example of a manufacturing method of the transduction film 10 will be described with reference to FIGS. 5A to 5E.

Figure 5A:
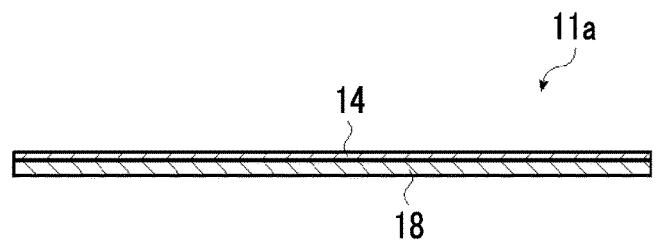
FIG. 5A is a conceptual view for explaining an example of a manufacturing method of the electroacoustic transduction film.

First, as illustrated in FIG. 5A, a sheet-like material 11a is prepared in which the lower electrode 14 is formed on the lower protective layer 18. The sheet-like material 11a may be prepared by forming a copper thin film or the like as the lower electrode 14 on the surface of the lower protective layer 18 using vacuum vapor deposition, sputtering, plating, and the like.

In a case where the lower protective layer 18 is extremely thin, and thus the handling ability is degraded, the lower protective layer 18 with a separator (temporary support) may be used as necessary. As the separator, a PET film having a thickness of approximately 25 to 100 μm, and the like are able to be used. The separator may be removed after thermal compression bonding of the thin film electrode and the protective layer immediately before forming a side surface insulating layer, a second protective layer, and the like.

Alternatively, a commercially available product in which a copper thin film or the like is formed on the lower protective layer 18 may also be used as the sheet-like material 11a.

On the other hand, a coating material is prepared by dissolving a polymer material (hereinafter, also referred to as a viscoelastic material) having a cyanoethyl group, such as cyanoethylated PVA, in an organic solvent, further adding the piezoelectric body particles 26 such as PZT particles thereto, and stirring and dispersing the resultant. The organic solvent is not particularly limited, and as the organic solvent, various organic solvents such as dimethylformamide (DMF), methyl ethyl ketone, and cyclohexanone are able to be used.

In a case where the sheet-like material 11a described above is prepared and the coating material is prepared, the coating material is cast (applied) onto the surface of the sheet-like material, and the organic solvent is evaporated and dried. Accordingly, as illustrated in FIG. 5B, a laminated body 11b in which the lower electrode 14 is provided on the lower protective layer 18 and the piezoelectric layer 12 is formed on the lower electrode 14 is prepared.

A casting method of the coating material is not particularly limited, and as the casting method, all known methods (coating devices) such as a slide coater or a doctor knife are able to be used.

Figure 5B:
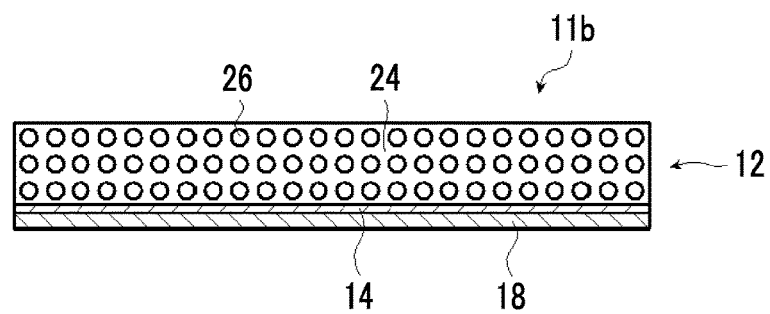
FIG. 5B is a conceptual view for explaining the example of the manufacturing method of the electroacoustic transduction film.

Alternatively, in a case where the viscoelastic material is a material that is able to be heated and melted like cyanoethylated PVA, a melted material is prepared by heating and melting the viscoelastic material and adding and dispersing an additive polymer material and the piezoelectric body particles 26 therein, is extruded into a sheet shape on the sheet-like material 11a illustrated in FIG. 5A by extrusion molding or the like, and is cooled, thereby preparing the laminated body 11b in which the lower electrode 14 is provided on the lower protective layer 18 and the piezoelectric layer 12 is formed on the lower electrode 14 as illustrated in FIG. 5B.

In addition, as described above, in the transduction film 10, in addition to the viscoelastic material such as cyanoethylated PVA, a polymer piezoelectric material such as PVDF may be added to the viscoelastic matrix 24.

In a case where the polymer piezoelectric material is added to the viscoelastic matrix 24, the polymer piezoelectric material added to the coating material may be dissolved. Alternatively, the polymer piezoelectric material to be added may be added to the heated and melted viscoelastic material and may be heated and melted.

In a case where the laminated body 11b in which the lower electrode 14 is provided on the lower protective layer 18 and the piezoelectric layer 12 is formed on the lower electrode 14, is prepared, it is preferable that the piezoelectric layer 12 is subjected to polarization processing (poling).

A polarization processing method of the piezoelectric layer 12 is not particularly limited, and as the polarization processing method, a known method is able to be used. As a preferred polarization processing method, a method illustrated in FIGS. 5C and 5D is exemplified.

Figure 5C:
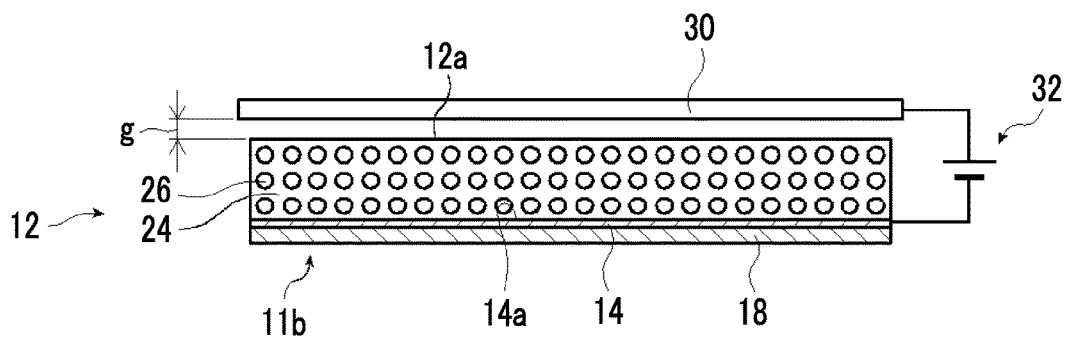
FIG. 5C is a conceptual view for explaining the example of the manufacturing method of the electroacoustic transduction film.
Figure 5D:
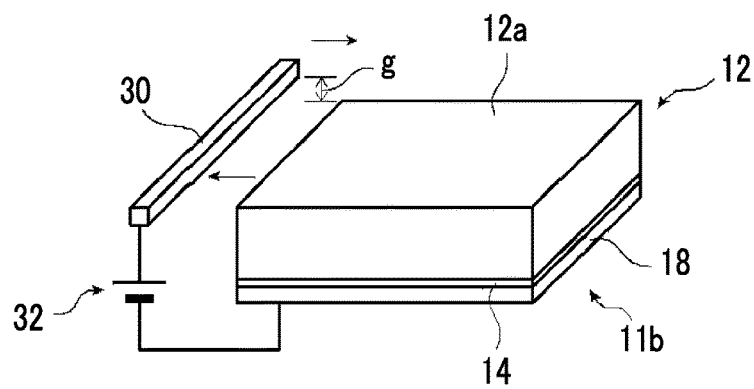
FIG. 5D is a conceptual view for explaining the example of the manufacturing method of the electroacoustic transduction film.

In this method, as illustrated in FIGS. 5C and 5D, for example, a gap g of 1 mm is opened on an upper surface 12a of the piezoelectric layer 12 of the laminated body 11b, and a rod-like or wire-like corona electrode 30 which is able to be moved along the upper surface 12a is disposed. Then, the corona electrode 30 and the lower electrode 14 are connected to a direct-current power source 32.

Furthermore, heating means for heating and holding the laminated body 11b, for example, a hot plate, is prepared.

Then, in a state where the piezoelectric layer 12 is heated and held by the heating means, for example, at a temperature of 100° C., a direct-current voltage of a few kV, for example, 6 kV, is applied between the lower electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the polarization processing.

During the polarization processing using the corona discharge (hereinafter, for convenience, also referred to as corona poling processing), known rod-like moving means may be used to move the corona electrode 30.

In addition, in the corona poling processing, a method of moving the corona electrode 30 is not limited. That is, the corona electrode 30 is fixed, a moving mechanism for moving the laminated body 11b is provided, and the polarization processing may be performed by moving the laminated body 11b. Moving means for a known sheet-like material may be used to move the laminated body 11b.

Furthermore, the number of corona electrodes 30 is not limited to one, and the corona poling processing may be performed by using a plurality of lines of corona electrodes 30.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper electrode 16 is formed before the polarization processing.

Before the polarization processing, calender processing may be performed to smoothen the surface of the piezoelectric layer 12 using a heating roller or the like. By performing the calender processing, a thermal compression bonding process described below is able to be smoothly performed.

In this way, while the piezoelectric layer 12 of the laminated body 11b is subjected to the polarization processing, a sheet-like material 11c is prepared in which the upper electrode 16 is formed on the upper protective layer 20. This sheet-like material 11c may be prepared by forming a copper thin film or the like as the upper electrode 16 on the surface of the upper protective layer 20 using vacuum vapor deposition, sputtering, plating, and the like.

Figure 5E:
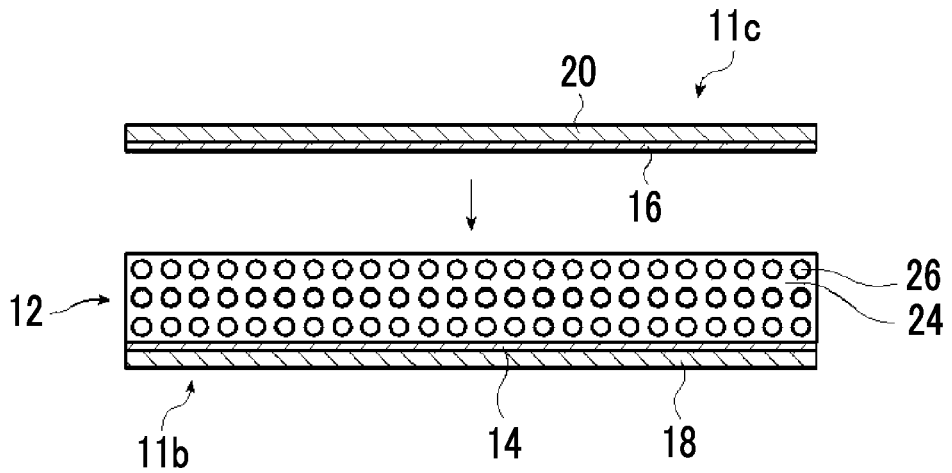
FIG. 5E is a conceptual view for explaining the example of the manufacturing method of the electroacoustic transduction film.

Next, as illustrated in FIG. 5E, the sheet-like material 11c is laminated on the laminated body 11b in which the piezoelectric layer 12 is subjected to the polarization processing while the upper electrode 16 faces the piezoelectric layer 12.

Furthermore, a laminated body of the laminated body 11b and the sheet-like material 11c is interposed between the upper protective layer 20 and the lower protective layer 18, and is subjected to the thermal compression bonding using a heating press device, a heating roller pair, or the like such that the transduction film 10 is prepared.

Manufacturing of the transduction film 10 may be performed using the sheet-like material in the form of a cut sheet, or may be performed by roll-to-roll (hereinafter, also referred to as RtoR).

As is well known, RtoR is a manufacturing method of unwinding, from a roll around which a long raw material is wound, the raw material, performing various treatments such as film formation and surface treatments while transporting the raw material in the longitudinal direction, and winding again the treated raw material into a roll shape.

Next, the first cushion layer 102 will be described.

As described above, the first cushion layer 102 is made of a three-dimensional solid knitted fabric.

The first cushion layer 102 acts as a cushion when the electroacoustic transducer 100 is used as a pillow or a headrest. In addition, the first cushion layer 102 covers the transduction unit 40 and has a function of protecting the transduction unit 40, particularly the transduction film 10.

As the first cushion layer 102, various commercially available three-dimensional solid knitted fabrics such as FUSION manufactured by Asahi Kasei Corporation, Cubic-i manufactured by UNITIKA TECHNOS. LTD., and 3D fabrics manufactured by Suminoe Textile Co., Ltd.

Such a three-dimensional solid knitted fabric consists of a front surface portion, a connecting portion, and a rear surface portion, the front surface portion and the rear surface portion have a structure with good air permeability in which a mesh, honeycomb, or smooth structure is formed with fibers, and the connecting portion has a structure that connects the front surface portion and the rear surface portion in a thickness direction using monofilament yarns.

Such a three-dimensional solid knitted fabric has an effect of improving strength unique to the three-dimensional solid knitted fabric despite its much higher porosity than that of a normal cushion such as urethane foam such that the three-dimensional solid knitted fabric has high air permeability in the thickness direction simultaneously with shape retention and elasticity required for a cushion. In addition, since the fibers are bonded at the end portions, vibration is less likely to occur, and vibration of sound, that is, the air is less likely to be transmitted to the fibers, thereby reducing the attenuation of the transmitted sound waves.

As a forming material of the first cushion layer 102, that is, the three-dimensional solid knitted fabric, polyester, nylon, polypropylene, or the like can be used. Among them, from the viewpoints of shape retention, durability, water resistance, and the like, polyester or nylon is preferable.

In addition, from the viewpoint of making the overall thickness of the first cushion layer 102 appropriate when used as a pillow or a headrest, the cushioning property, protection of the transduction film 10, sound permeability, ensuring the installation space of an error microphone, and the like, the thickness of the first cushion layer 102 is preferably 3 mm to 40 mm, and more preferably 10 mm to 20 mm.

The second cushion layer 104 acts as a cushion when the electroacoustic transducer 100 is used as a pillow or a headrest. In addition, the second cushion layer 104 is used to place the transduction unit 40 and fix the transduction unit 40.

As described above, in the example illustrated in FIG. 1, two concave portions are formed in the second cushion layer 104, and the transduction units 40 are disposed in the concave portions. The two concave portions are formed at positions symmetric with respect to the center line that halves the longitudinal direction of the principal surface of the second cushion layer 104. Therefore, the two transduction units 40 are disposed at positions symmetric with respect to the center line of the principal surface of the first cushion layer 102.

The forming material of the second cushion layer 104 is not limited, but is preferably any one of an integral molded product of urethane foam, wadding of inelastic crimped fibers, and a fiber-based cushion obtained by bonding inelastic crimped fibers with a binder. Alternatively, a three-dimensional solid knitted fabric similar to the first cushion layer 102 can also be used.

In addition, from the viewpoint of making the overall thickness of the second cushion layer 104 appropriate when used as a pillow or a headrest, the cushioning property, holding of the transduction unit 40, durability, and the like, the second cushion layer 104 is preferably 20 mm to 100 mm, and more preferably 30 mm to 60 mm.

In the example illustrated in FIG. 1, the configuration in which the concave portions are formed in the second cushion layer 104 and the transduction units 40 are disposed in the concave portions is provided, but the example is not limited thereto. A configuration in which the transduction unit 40 is placed on a flat second cushion layer 104 and the transduction unit 40 is interposed between the first cushion layer 102 and the second cushion layer 104 may also be provided. At this time, the first cushion layer 102 and the second cushion layer 104 deform in response to the shape of the transduction unit 40 and holds the transduction unit 40.

The microphone 106 is used for detecting noise when the electroacoustic transducer 100 is used as a noise cancelling device that performs ANC.

As described above, the microphone 106 is disposed at a position overlapping the transduction unit 40 in the surface direction of the principal surface of the first cushion layer 102 on the first cushion layer 102.

In the present invention, since the first cushion layer 102 is included, the microphone 106 can be disposed on a straight line between the transduction unit 40 and the ear.

Furthermore, the microphone 106 is connected to the transduction unit 40 via a personal computer (PC), an electronic circuit, or the like, and an amplifier (amp).

As the microphone 106, various known microphones can be used. From the viewpoints of miniaturization, thinning, and nonmagnetic properties, an electret capacitor microphone (ECM) is suitable.

Here, in the example illustrated in FIG. 1, the configuration in which the microphone 106 is disposed on the surface of the first cushion layer 102 is provided. However, the example is not limited thereto, and the microphone 106 may be disposed in the first cushion layer 102.

Figure 6:
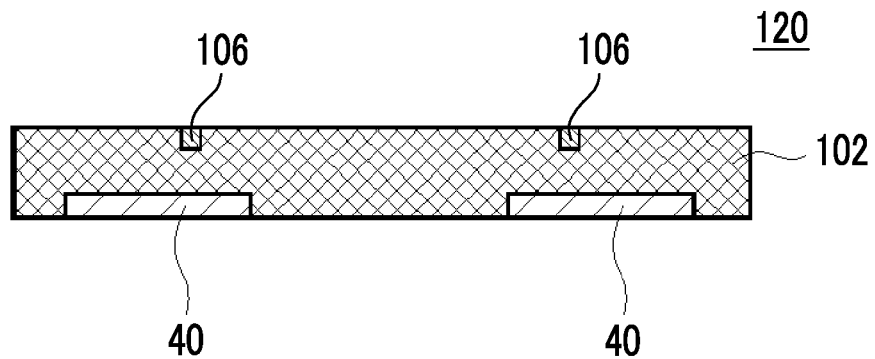
FIG. 6 is a sectional view conceptually illustrating another example of the electroacoustic transducer of the present invention.

The electroacoustic transducer 100 illustrated in FIG. 1 has the configuration in which the first cushion layer 102 is disposed on the transduction film 10 side of the transduction unit 40 and the second cushion layer 104 is disposed on the surface of the transduction unit 40 on the side opposite to the transduction film 10. However, the electroacoustic transducer 100 is not limited thereto, and may have a configuration without the second cushion layer 104 like an electroacoustic transducer 120 illustrated in FIG. 6.

Here, in the example illustrated in FIG. 1, the electroacoustic transducer 100 is used as a pillow or a headrest having a noise cancelling device that performs active noise control (ANC). However, the example is not limited thereto, and the electroacoustic transducer 100 may also be used as a pillow or a headrest in which a speaker for reproducing music is embedded.

Figure 7:
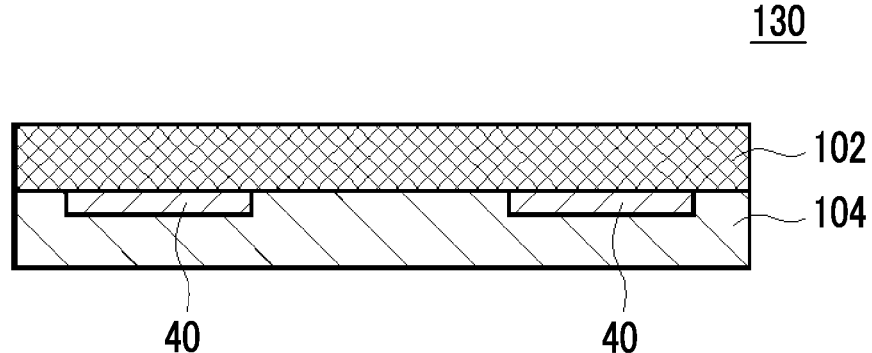
FIG. 7 is a sectional view conceptually illustrating another example of the electroacoustic transducer of the present invention.

In a case where the electroacoustic transducer 100 is used as a pillow with an embedded speaker, for example, like an electroacoustic transducer 130 illustrated in FIG. 7, a configuration having the two transduction units 40, the first cushion layer 102, and the second cushion layer 104 without the microphones 106 may be provided.

Figure 8:
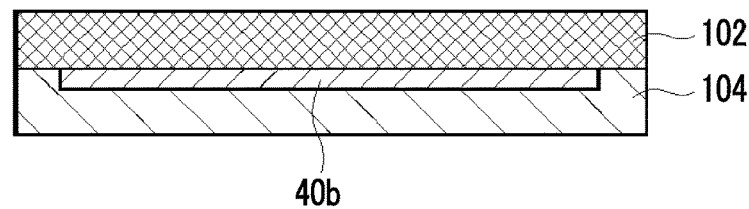
FIG. 8 is a sectional view conceptually illustrating another example of the electroacoustic transducer of the present invention.

In addition, in the example illustrated in FIGS. 1 and 7, the configuration having the two transduction units 40 is provided. However, the example is not limited thereto, and may have a configuration having a single transduction unit 40b as in an electroacoustic transducer 140 illustrated in FIG. 8, or may have a configuration having three or more transduction units 40. In addition, in a case of having two or more transduction units 40, the shapes, sizes, and the like of the transduction units 40 may be different from each other.

In a case of using the electroacoustic transducer as a pillow (headrest) with an embedded speaker, for example, the electroacoustic transducer may be configured to have two transduction units 40 to perform stereo reproduction. Alternatively, the electroacoustic transducer may be configured to have three transduction units 40 to perform 2.1 channel reproduction.

On the other hand, in a case of using the electroacoustic transducer as a pillow (headrest) having a noise cancelling device, the electroacoustic transducer is preferably configured to have two transduction units 40 and two microphones 106 corresponding to the positions of the ears of a person who uses the pillow.

In addition, since the transduction film 10 used as the vibration plate of the transduction unit 40 is a nonmagnetic body which does not use a magnet and a coil, the electroacoustic transducer 100 can be suitably used as an ANC system for a magnetic resonance imaging (MRI) apparatus.

In addition, the use of the electroacoustic transducer of the present invention is not limited to a pillow (headrest) provided with a noise cancelling device or a pillow (headrest) with an embedded speaker.

For example, the electroacoustic transducer can be used as a headrest in which a telephone is embedded, a pillow in which an alarm clock is embedded, or the like. In addition, by assembling the electroacoustic transducer into bedding such as a bend and using the transduction unit as a sensor, for example, it is possible to detect an operation (the number of turns) of a bedridden patient.

As described above, the electroacoustic transducer of the present invention is described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention.

Example 1

According to the method illustrated in FIGS. 5A to 5E described above, the transduction film 10 illustrated in FIG. 4 was prepared.

First, cyanoethylated PVA (CR-V manufactured by Shin-Etsu Chemical Co., Ltd.) was dissolved in methyl ethyl ketone (MEK) at the following compositional ratio. Thereafter, PZT particles were added to this solution at the following compositional ratio, and were dispersed by using a propeller mixer (rotation speed 2000 rpm), and thus a coating material for forming the piezoelectric layer 12 was prepared.

| | |
|---|---|
| PZT Particles | 1000 parts by mass |
| Cyanoethylated PVA | 100 parts by mass |
| MEK | 600 parts by mass |

In addition, the PZT particles were obtained by sintering commercially available PZT raw material powder at 1000° C. to 1200° C. and thereafter crushing and classifying the resultant so as to have an average particle diameter of 3.5 µm.

The sheet-like materials 11a and 11c in each of which a copper thin film having a thickness of 0.1 µm was vacuum vapor deposited on a PET film having a thickness of 4 µm were prepared. That is, in this example, the upper electrode 16 and the lower electrode 14 are copper vapor deposition thin films having a thickness of 0.1 µm, and the upper protective layer 20 and the lower protective layer 18 are PET films having a thickness of 4 µm.

In order to obtain good handleability during the process, as the PET film, a film with a separator (temporary support PET) having a thickness of 50 µm attached thereto was used, and the separator of each protective layer was removed after the thermal compression bonding of the thin film electrodes and the protective layers.

The coating material for forming the piezoelectric layer 12 prepared as described above was applied onto the lower electrode 14 (the copper vapor deposition thin film) of the sheet-like material 11a by using a slide coater. Furthermore, the coating material was applied such that the film thickness of the coating film after being dried was 20 µM.

Next, a material in which the coating material was applied onto the sheet-like material 11a was heated and dried in an oven at 120° C. such that MEK was evaporated. Accordingly, the laminated body 11b was prepared in which the lower electrode 14 made of copper was provided on the lower protective layer 18 made of PET and the piezoelectric layer 12 (piezoelectric layer) having a thickness of 20 µm was formed thereon.

The piezoelectric layer 12 of the laminated body 11b was subjected to the polarization processing by corona poling illustrated in FIGS. 5C and 5D. Furthermore, the polarization processing was performed by setting the temperature of the piezoelectric layer 12 to 100° C., and applying a direct-current voltage of 6 kV between the lower electrode 14 and the corona electrode 30 so as to cause corona discharge to occur.

The sheet-like material 11c was laminated on the laminated body 11b which was subjected to the polarization processing while the application surface of the applied film in which a mixture of cyanoethylated pullulan and cyanoethylated PVA (CR-M manufactured by Shin-Etsu Chemical Co., Ltd.) was applied onto the upper electrode 16 (copper thin film side) so as to have a thickness of 0.3 µm, faced the piezoelectric layer 12.

Next, the laminated body of the laminated body 11b and the sheet-like material 11c was subjected to thermal compression bonding at 120° C. by using a laminator device, and thus the piezoelectric layer 12 adhered to the upper electrode 16 and the lower electrode 14 such that the transduction film 10 was prepared.

The transduction unit 40 was prepared by assembling the prepared transduction film 10 into the case 42.

Here, the size of the vibration region in the transduction unit 40 was set to 110 mm×110 mm.

The case 42 is a box-shaped container having an open surface, and an aluminum rectangular container having outer dimensions of 120 mm×120 mm, an open surface size of 110 mm×110 mm, a depth of 3 mm, and a bottom plate thickness of 1 mm was used.

In addition, the viscoelastic support 46 was disposed in the case 42. The viscoelastic support 46 was made of glass wool having a height of 25 mm before assembly and a density of 32 kg/m$^3$.

In addition, as the pressing member 48, an aluminum plate-like member having an opening size of 110 mm×110 mm was used.

The transduction film 10 was disposed so as to cover the viscoelastic support 46 and the opening of the case 42, and the peripheral portion thereof was fixed by the pressing member 48 such that an appropriate tension and curvature were applied to the transduction film 10 by the viscoelastic support 46.

As the second cushion layer 104, an integral molded cushion having a thickness of 30 mm and a size of 500 mm×300 mm and formed of urethane foam as its material was used.

Two concave portions having a size of 120 mm×120 mm and a depth of 3 mm were provided at positions symmetric with respect to the center line of the second cushion layer 104 at an interval of 160 mm therebetween. The transduction units 40 were respectively placed in the two concave portions of the second cushion layer 104 such that the transduction film 10 side faces upward.

As the first cushion layer 102, a three-dimensional solid knitted fabric having a thickness of 25 mm and a size of 500 mm×300 mm and formed of FUSION (manufactured by Asahi Kasei Corporation) as its material was used.

The first cushion layer 102 was laminated to cover the two transduction units 40 placed on the second cushion layer 104.

Furthermore, the two microphones 106 (KUB282 manufactured by Hosiden Corporation) were disposed at positions symmetric with respect to the center line on the first cushion layer 102 at an interval of 200 mm therebetween, thereby preparing the electroacoustic transducer 100. That is, the two microphones 106 are respectively disposed at the positions overlapping the transduction units 40 in the surface direction of the principal surface of the first cushion layer 102.

Evaluation

With a configuration in which the transduction unit 40 and the microphone 106 of the electroacoustic transducer 100, which were disposed at the positions overlapping each other in the surface direction, were connected to a personal computer (PC) and an amplifier (amp) and a sound having the inverted phase to cancel out noise was reproduced by the transduction unit 40 on the basis of a noise signal detected by the microphone 106, the electroacoustic transducer 100 was used as a noise cancelling device performing ANC, and a noise reduction effect was evaluated.

Figure 9:
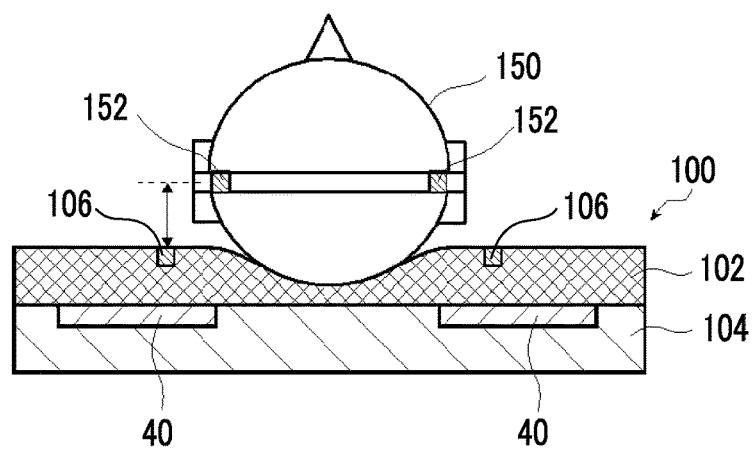
FIG. 9 is a schematic sectional view for explaining a measuring method in examples.

Specifically, as illustrated in FIG. 9, a dummy head having a mass of 3 kg (manufactured by ACO Co., Ltd.) was placed substantially at the center of the first cushion layer 102 of the electroacoustic transducer 100. A microphone 152 was disposed at the position of the eardrum of the dummy head 150.

Next, a noise source (commercially available dynamic speaker) was placed at a position separated by 50 cm in the surface direction of the transduction film.

First, an MR noise of about 90 dB was generated from the noise source without operating the electroacoustic transducer 100, a sound generated from the noise source was measured by the microphone 106 and the microphone 152, and the relationship between an amplitude and a time was obtained by operating the electroacoustic transducer 100 after five seconds. A graph of the measurement results of the microphone 106 is shown in FIG. 10, and a graph of the measurement results of the microphone 152 is shown in FIG. 11.

Figure 10:
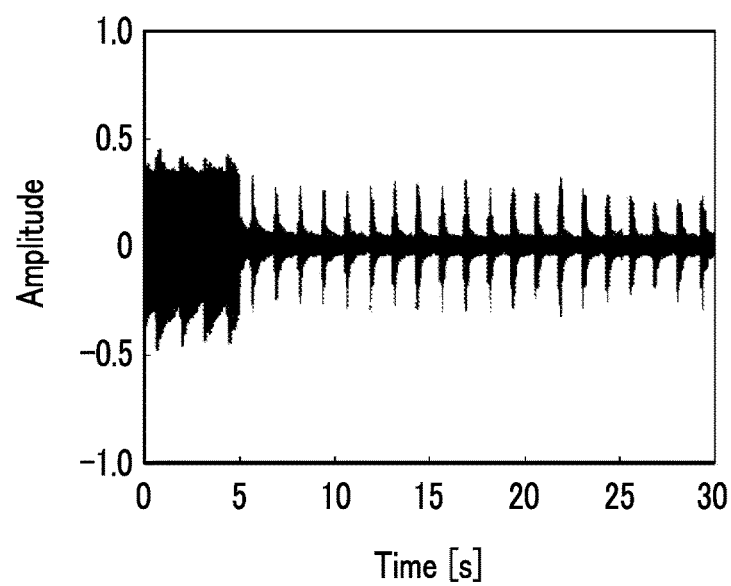
FIG. 10 is a graph showing the relationship between a time and an amplitude.

From the graph shown in FIG. 10, it can be seen that, at the position of the microphone 106 as an error microphone detecting a noise signal, the periodic component of the MR noise can be reduced by about 40 dB at the maximum.

Figure 11:
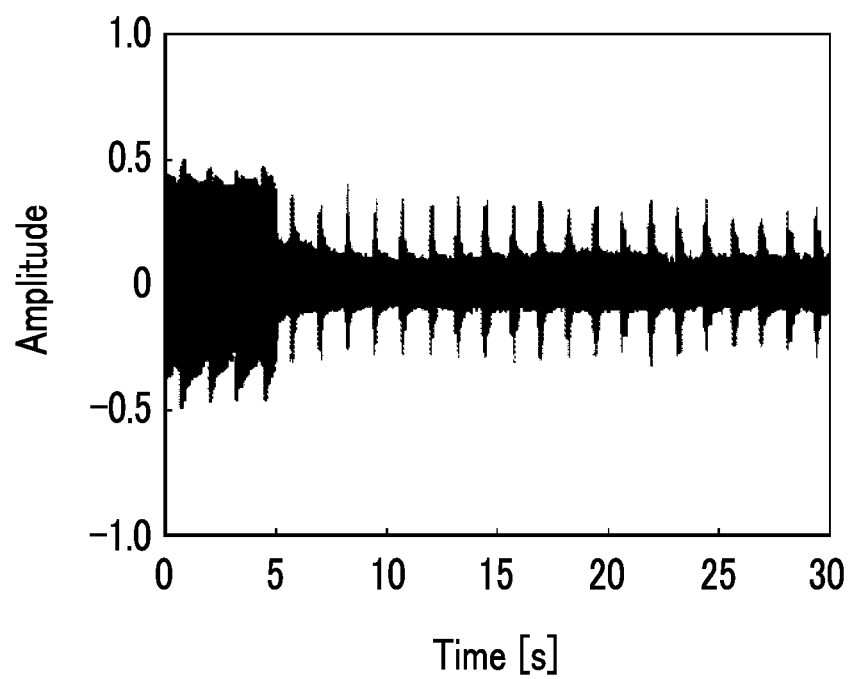
FIG. 11 is a graph showing the relationship between a time and an amplitude.

From the graph shown in FIG. 11, it can be seen that, at the position of the microphone 152 at the position of the eardrum, the periodic component of the MR noise can be reduced by about 20 dB at the maximum.

From the above results, the effect of the present invention is obvious.

EXPLANATION OF REFERENCES

10: electroacoustic transduction film
11a, 11c: sheet-like material
11b: laminated body
12: piezoelectric layer
14: lower thin film electrode
16: upper thin film electrode
18: lower protective layer
20: upper protective layer
24: viscoelastic matrix
26: piezoelectric body particles
30: corona electrode
32: direct-current power source
40: electroacoustic transduction unit
42: case
46: viscoelastic support
48: pressing member
100, 120, 130, 140: electroacoustic transducer
102: first cushion layer
104: second cushion layer
106, 152: microphone
150: dummy head

What is claimed is:

1. An electroacoustic transducer comprising:
an electroacoustic transduction unit having an electroacoustic transduction film including a polymer composite piezoelectric body in which piezoelectric body particles are dispersed in a viscoelastic matrix formed of a polymer material having viscoelasticity at a normal temperature and thin film electrodes respectively laminated on both surfaces of the polymer composite piezoelectric body, and an elastic support disposed in close contact with one principal surface of the electroacoustic transduction film to bend the shape of the electroacoustic transduction film; and
a first cushion layer that is in contact with the electroacoustic transduction film on an electroacoustic transduction film side of one or more electroacoustic transduction units to cover the one or more electroacoustic transduction units and is formed of a three-dimensional solid knitted fabric.

2. The electroacoustic transducer according to claim 1, wherein two electroacoustic transduction units are provided, and
the two electroacoustic transduction units are disposed at positions symmetric with respect to a center line of a principal surface of the first cushion layer.

3. The electroacoustic transducer according to claim 1, further comprising:
a second cushion layer which covers the electroacoustic transduction unit on a surface of the electroacoustic transduction unit, the surface being opposite to the electroacoustic transduction film.

4. The electroacoustic transducer according to claim 2, further comprising:
a second cushion layer which covers the electroacoustic transduction unit on a surface of the electroacoustic transduction unit, the surface being opposite to the electroacoustic transduction film.

5. The electroacoustic transducer according to claim 1, wherein the first cushion layer is in contact with the electroacoustic transduction film.

6. The electroacoustic transducer according to claim 4, wherein the first cushion layer is in contact with the electroacoustic transduction film.

7. The electroacoustic transducer according to claim 1, wherein a forming material of the first cushion layer is polyester or nylon.

8. The electroacoustic transducer according to claim 6, wherein a forming material of the first cushion layer is polyester or nylon.

9. The electroacoustic transducer according to claim 1, wherein a thickness of the first cushion layer is 3 mm to 30 mm.

10. The electroacoustic transducer according to claim 8, wherein a thickness of the first cushion layer is 3 mm to 30 mm.

11. The electroacoustic transducer according to claim 1, wherein the second cushion layer is any one of an integral molded product of urethane foam, wadding of inelastic crimped fibers, and a fiber-based cushion obtained by bonding inelastic crimped fibers with a binder.

12. The electroacoustic transducer according to claim 10, wherein the second cushion layer is any one of an integral molded product of urethane foam, wadding of inelastic crimped fibers, and a fiber-based cushion obtained by bonding inelastic crimped fibers with a binder.

13. The electroacoustic transducer according to claim 1, further comprising:
a microphone disposed in the first cushion layer,
wherein the microphone is disposed at a position overlapping the electroacoustic transduction unit in a surface direction of a principal surface of the first cushion layer.

14. The electroacoustic transducer according to claim 12, further comprising:
a microphone disposed in the first cushion layer,
wherein the microphone is disposed at a position overlapping the electroacoustic transduction unit in a surface direction of a principal surface of the first cushion layer.

15. The electroacoustic transducer according to claim 13, wherein the electroacoustic transduction unit functions as a speaker which reproduces a noise cancelling signal generated on the basis of a noise signal detected by the microphone.

16. The electroacoustic transducer according to claim 14, wherein the electroacoustic transduction unit functions as a speaker which reproduces a noise cancelling signal generated on the basis of a noise signal detected by the microphone.

17. The electroacoustic transducer according to claim 1, wherein the elastic support is a viscoelastic support having viscoelasticity.

18. The electroacoustic transducer according to claim 1, wherein a curvature of a bent portion of the electroacoustic transduction film changes from a center toward a peripheral portion.

19. The electroacoustic transducer according to claim 1, wherein a shape of the bent portion when viewed in a direction perpendicular to the principal surface of the electroacoustic transduction film is a polygonal shape or a circular shape.

* * * * *